(12) United States Patent
Hong et al.

(10) Patent No.: US 11,981,995 B2
(45) Date of Patent: May 14, 2024

(54) CHEMICAL SUPPLY APPARATUS, METHOD FOR REMOVING PARTICLES FROM CHEMICAL, NOZZLE UNIT, AND SUBSTRATE TREATING APPARATUS

(71) Applicant: SEMES CO., LTD., Chungcheongnam-do (KR)

(72) Inventors: Yong Hoon Hong, Seoul (KR); Dohyeon Yoon, Chungcheongnam-do (KR); Heehwan Kim, Sejong-si (KR); Ji Young Lee, Chungcheongnam-do (KR); Young Su Kim, Chungcheongnam-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 775 days.

(21) Appl. No.: 17/086,061

(22) Filed: Oct. 30, 2020

(65) Prior Publication Data
US 2021/0130951 A1    May 6, 2021

(30) Foreign Application Priority Data
Oct. 31, 2019    (KR) .................... 10-2019-0137065

(51) Int. Cl.
*C23C 16/448*    (2006.01)
*C23C 16/44*    (2006.01)
(Continued)

(52) U.S. Cl.
CPC ...... *C23C 16/4485* (2013.01); *C23C 16/4412* (2013.01); *C23C 16/45563* (2013.01);
(Continued)

(58) Field of Classification Search
CPC ......... H01L 21/67017; H01L 21/67051; H01L 21/67; C23C 16/45563; C23C 16/4485;
(Continued)

(56) References Cited

U.S. PATENT DOCUMENTS

2007/0218656 A1* 9/2007 Miyagi ............ H01L 21/67051
                                                   438/478
2009/0297990 A1* 12/2009 Ono ..................... G03F 7/70341
                                                   355/77
(Continued)

FOREIGN PATENT DOCUMENTS

CN          103189143 A       7/2013
CN          106356319 A       1/2017
(Continued)

*Primary Examiner* — Benjamin L Osterhout
(74) *Attorney, Agent, or Firm* — Procopio, Cory, Hargreaves & Savitch LLP (57) ABSTRACT

A chemical supply apparatus includes an evaporation unit disposed downstream of a chemical supply source to vaporize supplied chemical thereto, a filter unit disposed downstream of the evaporation unit, wherein the filter unit filters impurities in the vaporized chemical while the vaporized chemical passes through the filter unit, a liquefaction unit disposed downstream of the filter unit to liquefy the vaporized chemical, and a chemical storage tank disposed downstream of the liquefaction unit to store the liquefied chemical therein, wherein an electrode is disposed between the chemical supply source and the liquefaction unit, wherein the (Continued)

electrode electrically reacts with the chemical or particles in the chemical to change electrical properties of the chemical or the particles.

15 Claims, 8 Drawing Sheets (51) Int. Cl.
*C23C 16/455* (2006.01)
*C23C 16/52* (2006.01)
*H01L 21/67* (2006.01)
*B05B 5/00* (2006.01)
*B05B 5/053* (2006.01)

(52) U.S. Cl.
CPC .............. *C23C 16/52* (2013.01); *H01L 21/67* (2013.01); *B05B 5/002* (2013.01); *B05B 5/0533* (2013.01); *H01L 21/67017* (2013.01); *H01L 21/67051* (2013.01)

(58) Field of Classification Search
CPC ..... C23C 16/52; C23C 16/4412; B05B 5/053; B05B 5/002
See application file for complete search history.

(56) References Cited

U.S. PATENT DOCUMENTS

| 2017/0032984 A1* | 2/2017 | Ito ..................... H01L 21/67051 |
| 2017/0087575 A1* | 3/2017 | Hashima ........... H01L 21/67051 |

FOREIGN PATENT DOCUMENTS

| JP | S6318076 A | 1/1988 |
| JP | H06-22224 B2 | 3/1994 |
| JP | H06226020 A | 8/1994 |
| JP | H1064873 A | 3/1998 |
| JP | 2000279900 A | 10/2000 |
| JP | 2007317821 A | 12/2007 |
| JP | 2013030707 A | 2/2013 |
| JP | 2013153063 A | 8/2013 |
| JP | 2017033991 A | 2/2017 |
| JP | 2017069552 A | 4/2017 |
| JP | 2017189755 A | 10/2017 |
| JP | 6535493 B2 | 6/2019 |
| JP | 2019085606 A | 6/2019 |
| KR | 20-0158122 Y1 | 10/1999 |
| KR | 10-2008-0088193 A | 10/2008 |
| KR | 10-2018-0121650 A | 11/2018 |
| WO | 2010/035396 A | 4/2010 |

* cited by examiner

CHEMICAL SUPPLY APPARATUS, METHOD FOR REMOVING PARTICLES FROM CHEMICAL, NOZZLE UNIT, AND SUBSTRATE TREATING APPARATUS

CROSS-REFERENCE TO RELATED APPLICATIONS

A claim for priority under 35 U.S.C. § 119 is made to Korean Patent Application No. 10-2019-0137065 filed on Oct. 31, 2019 in the Korean Intellectual Property Office, the entire contents of which are hereby incorporated by reference.

BACKGROUND

Embodiments of the inventive concept described herein relate to a chemical supply apparatus, a method for removing particles from chemical, a nozzle unit, and a substrate treating apparatus.

Various kinds of chemicals are used in a general semiconductor device manufacturing process and a flat panel display manufacturing process. For example, in a process of cleaning the substrate, various kinds of chemicals, such as IPA, may be used for cleaning the substrate to remove foreign matters remaining on a surface of the substrate.

An apparatus for supplying the chemical may include a central chemical supply system (CCSS). The chemical supplied from the CCSS is transferred to a mixing tank and then is used therein. A filter is disposed in a supply line connecting the CCSS to the mixing tank to remove particles mixed with the chemical. However, because the filter is expensive, a related industry demands a device that may reduce a cost.

Further, regardless of presence or absence of a filter, there is a high possibility that cations, anions, metal particles and nonpolar particles accumulate in the mixing tank because the chemical supply apparatus is not a circulating structure. An acidic solution is used to remove these particles, but there is no method to purify the chemical at high purity.

SUMMARY

Embodiments of the inventive concept provide a chemical supply apparatus, a method for removing particles from the chemical, a nozzle unit, and a substrate treating apparatus, which are capable of efficiently treating the substrate.

Embodiments of the inventive concept provide a chemical supply apparatus, and a method for removing particles from the chemical, which are capable of effectively removing particles mixed with the chemical, preferably cations, anions, metal particles and nonpolar particles.

Embodiments of the inventive concept provide a chemical supply apparatus, a method for removing particles from the chemical, a nozzle unit, and a substrate treating apparatus, which may control a potential of supplied chemical, and control a potential of the chemical purified at high purity, thereby to prevent ESD (Electro Static Discharge) phenomenon that occurs when the substrate and the chemical contact each other.

According to one aspect, a chemical supply apparatus includes an evaporation unit disposed downstream of a chemical supply source to vaporize supplied chemical thereto, a filter unit disposed downstream of the evaporation unit, wherein the filter unit filters impurities in the vaporized chemical while the vaporized chemical passes through the filter unit, a liquefaction unit disposed downstream of the filter unit to liquefy the vaporized chemical, and a chemical storage tank disposed downstream of the liquefaction unit to store the liquefied chemical therein, wherein an electrode is disposed between the chemical supply source and the liquefaction unit, wherein the electrode electrically reacts with the chemical or particles in the chemical to change electrical properties of the chemical or the particles.

In one embodiment of the chemical supply apparatus, the electrical reaction between the electrode and the chemical or the particles may include a reduction reaction of the particles.

In one embodiment of the chemical supply apparatus, the electrical reaction between the electrode and the chemical or the particles may include polarization of the particles.

In one embodiment of the chemical supply apparatus, the particles may include nonpolar particles.

In one embodiment of the chemical supply apparatus, the electrode may be included in the filter unit.

In one embodiment of the chemical supply apparatus, the electrode may be included in the liquefaction unit.

In one embodiment of the chemical supply apparatus, the electrode may be disposed at a front end of the filter unit.

In one embodiment of the chemical supply apparatus, the evaporation unit may include a first evaporation unit and a second evaporation unit, wherein each of the first evaporation unit and the second evaporation unit may include the electrode.

In one embodiment of the chemical supply apparatus, the particles may include metal particles.

According to another aspect, a method for removing particles contained in chemical includes changing electrical properties of the particles contained in the chemical, and collecting the particles whose electrical properties are changed.

In one embodiment of the method, the changing of the electrical properties of the particles contained in the chemical may include reducing the particles contained in the chemical.

In one embodiment of the method, the particles may include metal particles.

In one embodiment of the method, the changing of the electrical properties of the particles contained in the chemical may include polarizing the particles contained in the chemical.

In one embodiment of the method, the particles may include nonpolar particles.

According to still another aspect, a nozzle unit includes a body having a supply channel defined therein through which chemical is supplied, and an electrode received in the supply channel, wherein the electrode is connected to a ground line or a power supply.

In one embodiment of the nozzle unit, the nozzle unit may further include a controller, wherein the controller may enable or disable connection between the electrode and the ground line and connection between the electrode and the power supply.

In one embodiment of the nozzle unit, the power supply may apply a negative voltage to the electrode.

According to yet still another aspect, a substrate treating apparatus includes an evaporation unit disposed downstream of a chemical supply source to vaporize supplied chemical thereto, a filter unit disposed downstream of the evaporation unit, wherein the filter unit filters impurities in the vaporized chemical while the vaporized chemical passes through the filter unit, a liquefaction unit disposed downstream of the filter unit to liquefy the vaporized chemical, a chemical storage tank disposed downstream of the liquefaction unit to store the liquefied chemical therein, an electrode disposed between the chemical supply source and the liquefaction unit, wherein the electrode electrically reacts with the chemical or particles in the chemical to change electrical properties of the chemical or the particles, a container having a treating space defined therein, a support unit disposed in the treating space to support the substrate thereon, and a nozzle unit disposed downstream of the liquefaction unit and in fluid communication with the liquefaction unit, wherein the nozzle unit supplies the chemical onto the substrate supported on the support unit, wherein the nozzle unit includes a body having a supply channel defined therein through which chemical is supplied, and an electrode received in the supply channel, wherein the electrode of the nozzle unit is connected to a ground line or a power supply.

In one embodiment of the substrate treating apparatus, the nozzle unit may further include a controller, wherein the controller may enable or disable connection between the electrode and the ground line and connection between the electrode and the power supply.

In one embodiment of the substrate treating apparatus, the power supply may apply a negative voltage to the electrode.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Hereinafter, an embodiment of the inventive concept will be described in more detail with reference to the accompanying drawings. Embodiments of the inventive concept may be modified in various forms, and a scope of the inventive concept should not be construed as being limited to the following embodiments. The embodiments are provided to more completely explain the inventive concept to the skilled person to the art. Therefore, a shape of an element in the drawing is exaggerated to emphasize more clear description thereof.

Figure 1:
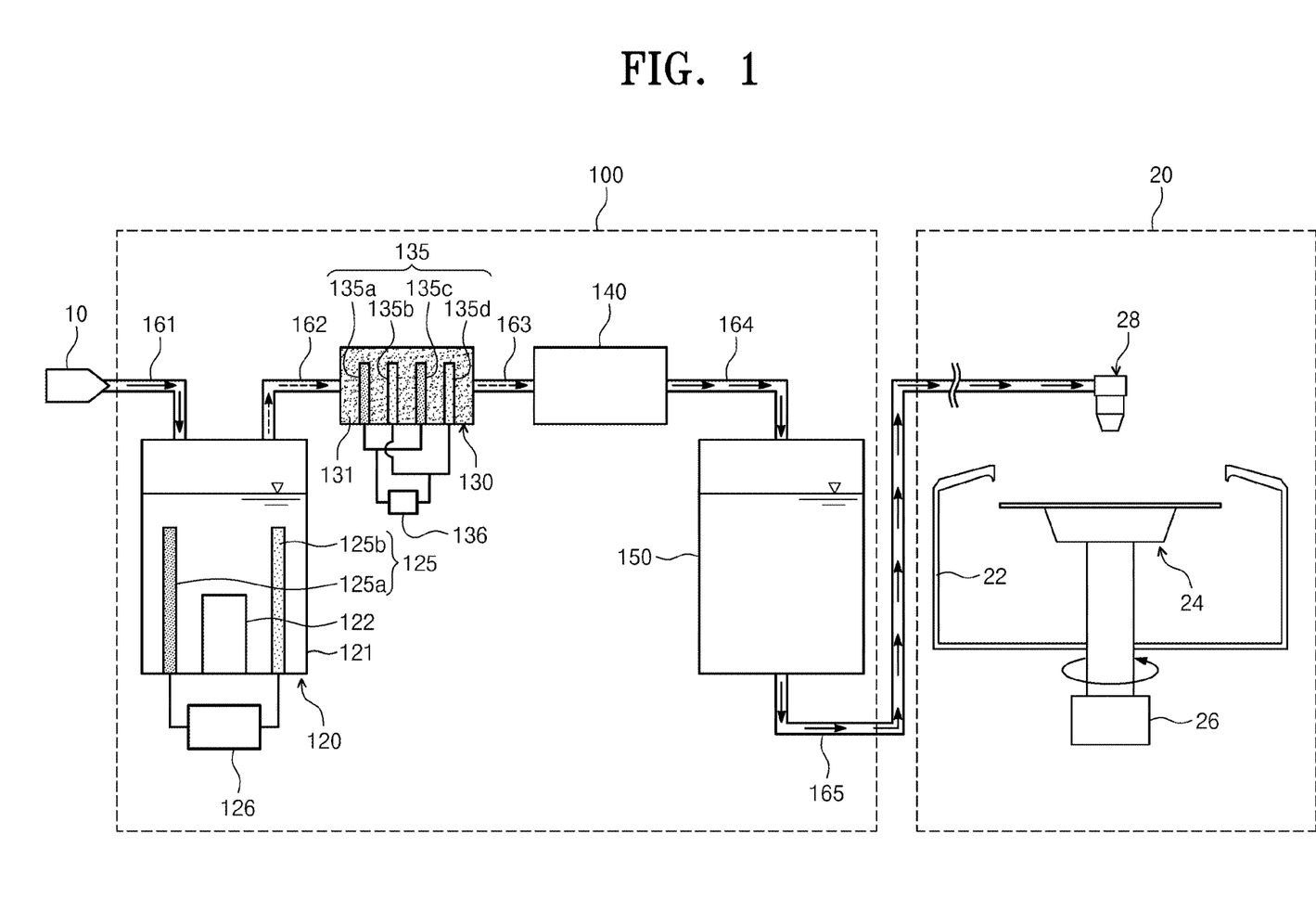
FIG. 1 is a diagram showing a substrate treating system according to the inventive concept.

FIG. 1 is a diagram showing a substrate treating system according to the inventive concept. Referring to FIG. 1, the substrate treating system according to the inventive concept includes a chemical supply source 10, a chemical treating apparatus 20, and a chemical supply apparatus 100.

The chemical supply source 10 stores chemical therein. For example, the chemical may be isopropyl alcohol chemical (hereinafter referred to as 'IPA'). The chemical supply source 10 is a facility that supplies the chemical to the chemical supply apparatus 100. For example, the chemical supply source 10 may be a central chemical supply system (CCSS).

The chemical treating apparatus 20 performs a process of treating a semiconductor substrate (hereinafter, wafer W). The chemical treating apparatus 20 has at least one process chamber. The process chamber includes a container 22, a spin chuck 24, a driver 26, and a nozzle unit 28.

The container 22 provides a space for cleaning the wafer W therein. The container 22 has a cup shape with an open top. The open top of the container 22 is used as a passage through which the wafer W may enter and exit.

The spin chuck 24 supports the wafer W thereon inside the container 22 during the process. The spin chuck 24 is installed in a center of the container 22 and performs rotation and vertical movement. The spin chuck 24 is driven by the driver 26. The nozzle unit 28 supplies the IPA to a treatment target surface of the wafer W rotated by the spin chuck 24 during the process. At least one nozzle unit 28 is provided.

The chemical supply apparatus 100 includes an evaporation unit 120, a filter unit 130, a liquefaction unit 140, a chemical storage tank 150, and supply lines 161, 162, 163, 164, and 165 connecting the evaporation unit 120, the filter unit 130, the liquefaction unit 140, and the chemical storage tank 150 to each other.

The evaporation unit 120 vaporizes the chemical. The evaporation unit 120 is disposed downstream of the chemical supply source 10. The evaporation unit 120 is connected to the chemical supply source 10 via a first supply line 161. The evaporation unit 120 vaporizes the chemical supplied from the chemical supply source 10. The evaporation unit 120 includes a tank 121, a heater 122 and an electrode 125. The electrode 125 may include a first electrode 125a and a second electrode 125b. The electrode 125 is connected to a power supply 126. The first electrode 125a may receive a positive voltage to act as a positive electrode, and the second electrode 125b may receive a negative voltage to act as a negative electrode. The supplied chemical is temporarily stored in the tank 121. The temporarily stored chemical may contain therein cations, anions, metal particles and nonpolar particles. The electrode 125 may remove cations, anions and metal particles. For example, the cations are collected on the negative electrode, and the anions are collected on the positive electrode. The metal particles are generally cations, and thus may be collected on the negative electrode while being reduced.

In a process in which the chemical is evaporated in the evaporation unit 120 and then moves to the liquefaction unit 140, the evaporated chemical may be filtered by the filter unit 130. The filter unit 130 is disposed between the evaporation unit 120 and the liquefaction unit 140. The evaporation unit 120 and the filter unit 130 are connected to each other via a second supply line 162, and the filter unit 130 and the liquefaction unit 140 are connected to each other via a third supply line 163.

The filter unit 130 removes unremoved particles in a vaporized state. The filter unit 130 may include a filter 131 and an electrode 135. The filter 131 may be embodied as a HEPA filter or a membrane filter, but is not limited thereto.

The electrode 135 may be included in the filter unit 130. In an embodiment, the electrode 135 may include a first electrode 135a, a second electrode 135b, a third electrode 135c, and a fourth electrode 135d. The first electrode 135a, the second electrode 135b, the third electrode 135c, and the fourth electrode 135d may be sequentially arranged on a movement path of the vaporized chemical. A positive voltage is applied to each of the first electrode 135a and the third electrode 135c to act as a positive electrode, while a negative voltage is applied to each of the second electrode 135b and the fourth electrode 135d to act as a negative electrode. An exemplary embodiment of the inventive concept illustrates that the electrode 135 is embodied as two pairs of electrode rods. However, the disclosure is not limited thereto. For example, the electrode 135 may be embodied as an ionizer, an electrostatic generating unit, or a sonicator.

The electrode 135 electrically reacts with the nonpolar particles to exhibit electrical properties. For example, the electrode 135 may apply an electric force to the nonpolar particles that are electrically neutral, thereby to causes polarization of the nonpolar particles. The nonpolar particles may be polarized and thus may be easily collected by the filter 131.

A plurality of filter units 130 may be arranged in series (not shown). In addition, a plurality of filter units 130 may be arranged in parallel.

Figure 2:
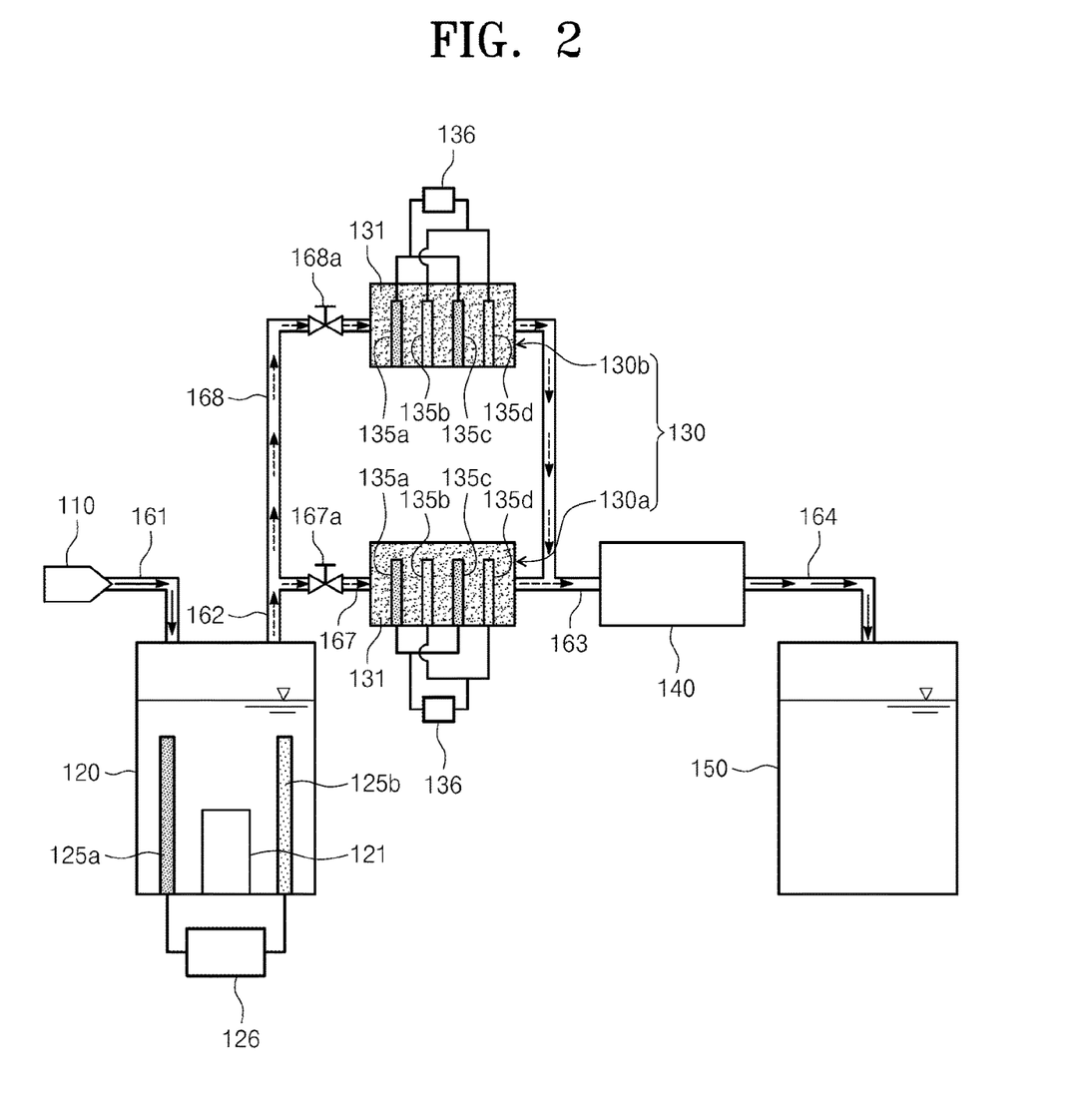
FIG. 2 shows an embodiment in which a plurality of filter units 130 are arranged in a parallel manner.

FIG. 2 shows an embodiment in which a plurality of filter units 130 arranged in parallel. In one example, the second supply line 162 is divided to a first branched line 167 and a second branched line 168, and then the branched lines 167 and 168 rejoin at the third supply line 163. A first filter unit 130a is disposed at the first branched line 167 and a second filter unit 130b is disposed at the second branched line 168. A valve 167a may be disposed at a front end of the first filter unit 130a in the first branched line 167. A valve 168a may be disposed at a front end of the filter unit 130b in the second branched line 168. As the plurality of filter units 130 are arranged in parallel, the apparatus may operate continuously using the other filter unit 130b while one filter unit 130a is being repaired.

Figure 3:
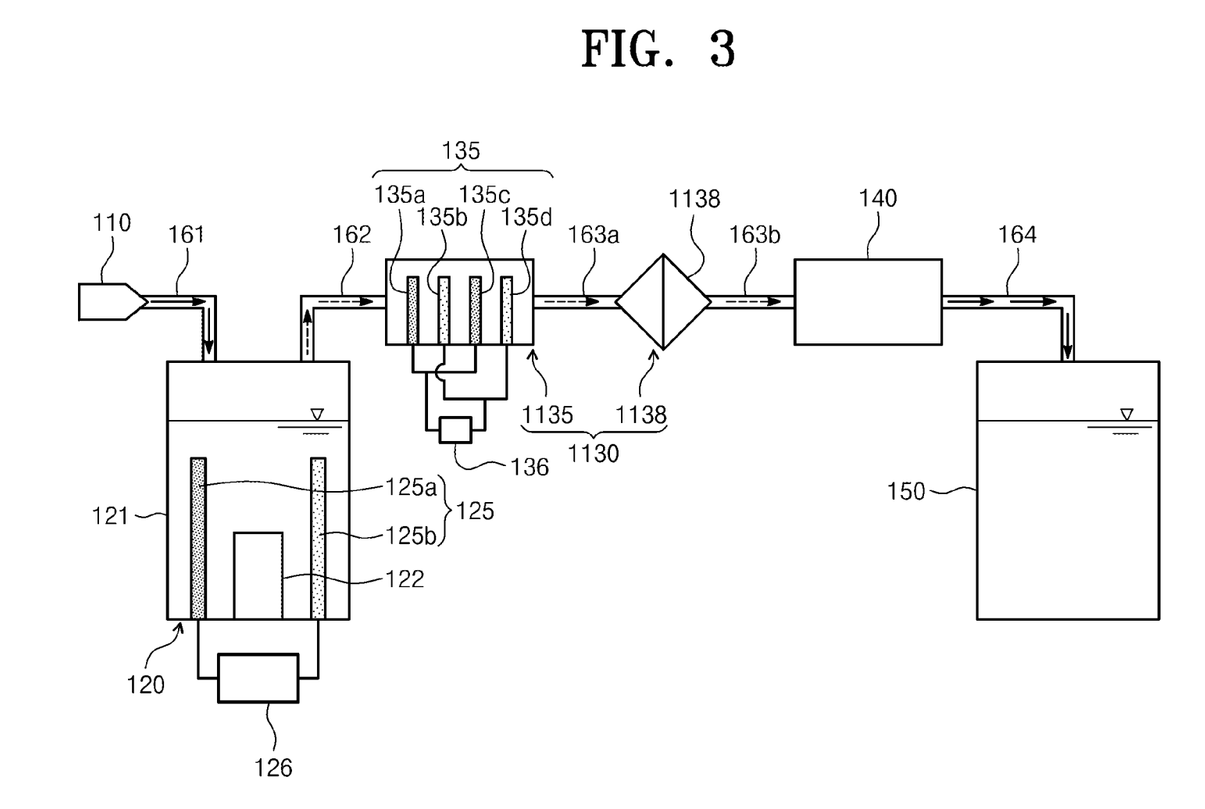
FIG. 3 shows a filter unit 1130 according to another embodiment.

FIG. 3 shows a filter unit 1130 according to another embodiment. In another embodiment, the filter unit 1130 may be divided to an electrode unit 1135 and a filter 1138. For example, the electrode unit 1135 is disposed at a front end or upstream of the filter 1138 to apply an electrical force to the vaporized chemical. This allows the particles to be polarized and thus to be collected by the filter 1138 disposed at a rear end or downstream thereof. The illustrated embodiment may be modified such that polarization occurs in electrically neutral particles using the provided electrode, and thus the polarized particles are collected using the filter.

Referring back to FIG. 1, the liquefaction unit 140 is disposed downstream of the filter unit 130. The liquefaction unit 140 liquefies the filtered chemical. The liquefied chemical is stored in the chemical storage tank 150. The chemical storage tank 150 is connected to the liquefaction unit 140 via a fourth supply line 164.

The chemical storage tank 150 receives the treated chemical and stores the same therein. The chemical storage tank 150 may include a plurality of chemical storage tanks 150. The chemical stored in the chemical storage tank 150 is free of the particles and thus has high purity.

The chemical stored in the chemical storage tank 150 is transferred to the chemical treating apparatus 20 and then supplied to the substrate through the nozzle unit 28. The nozzle unit 28 and the chemical storage tank 150 are connected to each other via a fifth supply line 165. A bubble remover (not shown) may be disposed at the fifth supply line 165. The bubble remover (not shown) removes bubbles from the chemical to be supplied to the chemical treating apparatus 20.

Figure 4:
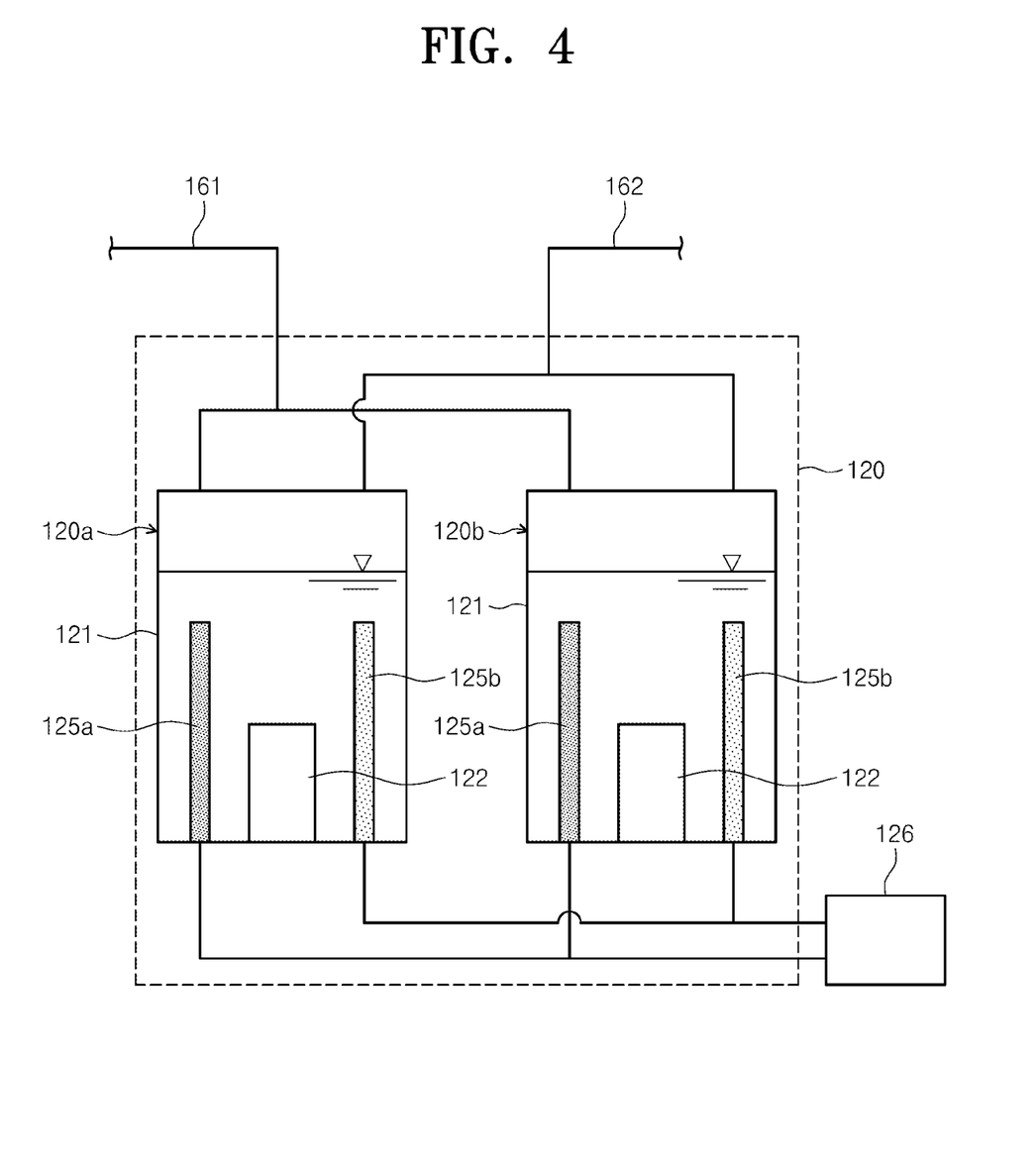
FIG. 4 is a view showing in more detail an evaporation unit 120 according to an embodiment.

FIG. 4 is a view showing in more detail the evaporation unit 120 according to an embodiment. In an embodiment, the evaporation unit 120 may include a first evaporation unit 120a and a second evaporation unit 120b. A description of each of a configuration of the first evaporation unit 120a and a configuration of the second evaporation unit 120b is replaced with the description of the evaporation unit 120 described above. Although the two evaporation units are shown according to an embodiment, the number thereof may be increased or decreased as needed. As the plurality of evaporation units 120 are arranged in parallel, for example, the apparatus may operate continuously using the second evaporation unit 120b during maintenance of the first evaporation unit 120a. In one embodiment, the maintenance may include cleaning a redox electrode.

Figure 5:
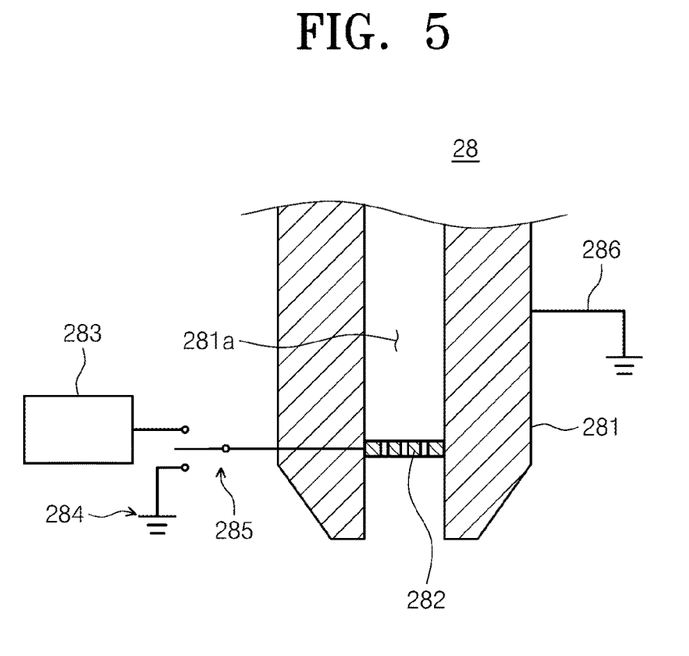
FIG. 5 and FIG. 6 show a nozzle unit 28 according to an embodiment of the inventive concept.
Figure 6:
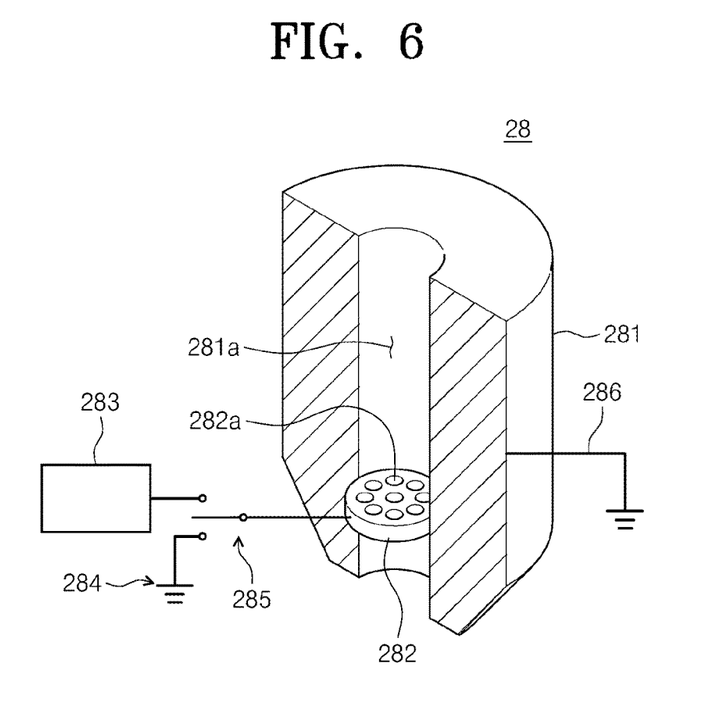
Figure 7:
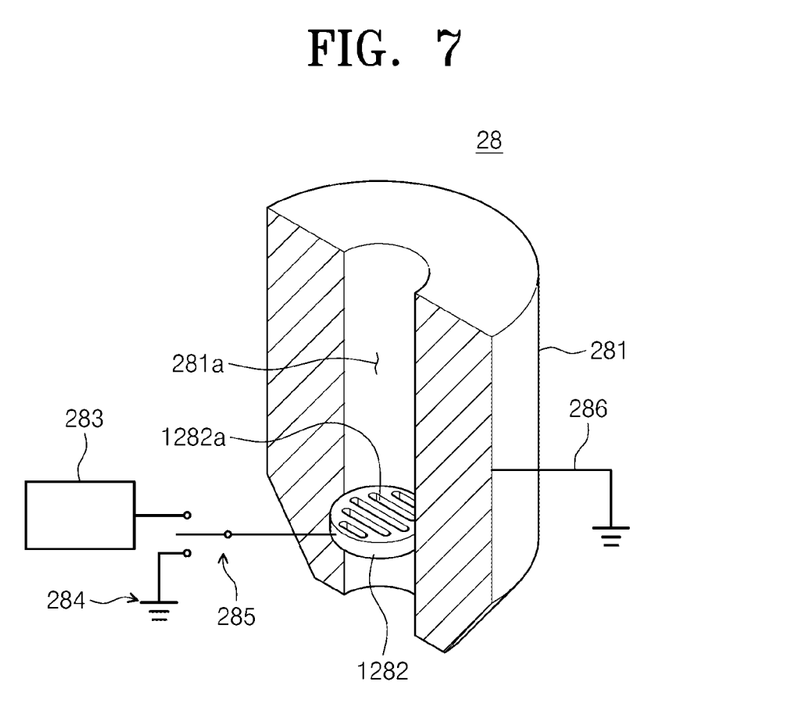
FIG. 7 shows an electrode 1282 according to another embodiment of a nozzle unit 28 according to an embodiment of the inventive concept.

FIG. 5 and FIG. 6 show the nozzle unit 28 according to an embodiment of the inventive concept. FIG. 5 is a cross-sectional view of the nozzle unit 28 according to an embodiment of the inventive concept, and FIG. 6 is a partial cutaway view of the nozzle unit 28 according to an embodiment of the inventive concept. The nozzle unit 28 includes a body 281 having a supply channel 281a defined therein to supply the chemical and an electrode 282 disposed at the supply channel 281a. The electrode 282 may be disposed at a position adjacent to a discharge end of the supply channel 281a. However, the disclosure is not limited thereto. The electrode 282 may be connected to a ground line 284 or a power supply 283. A selective connection thereof to the ground line 284 or the power supply 283 may be made via a switch 285. The switch 285 may be controlled by a controller (not shown). In one embodiment, the electrode 282 may be embodied as a disk extending in a perpendicular manner to a length direction of the supply channel 281a. Holes are formed in the disk and in a flow path direction to allow the chemical to pass therethrough. However, a shape of the electrode 282 is not limited thereto. The shape of the electrode 282 may not be limited particularly, as long as the electrode 282 is disposed in the supply channel 281a and to allow the chemical to pass therethrough, and the chemical has a sufficient contact with the electrode 282. For example, in another embodiment referring to FIG. 7, an electrode 1282 includes a plurality of slits 1282a, and the chemical may pass through the slits 1282a.

Figure 8:
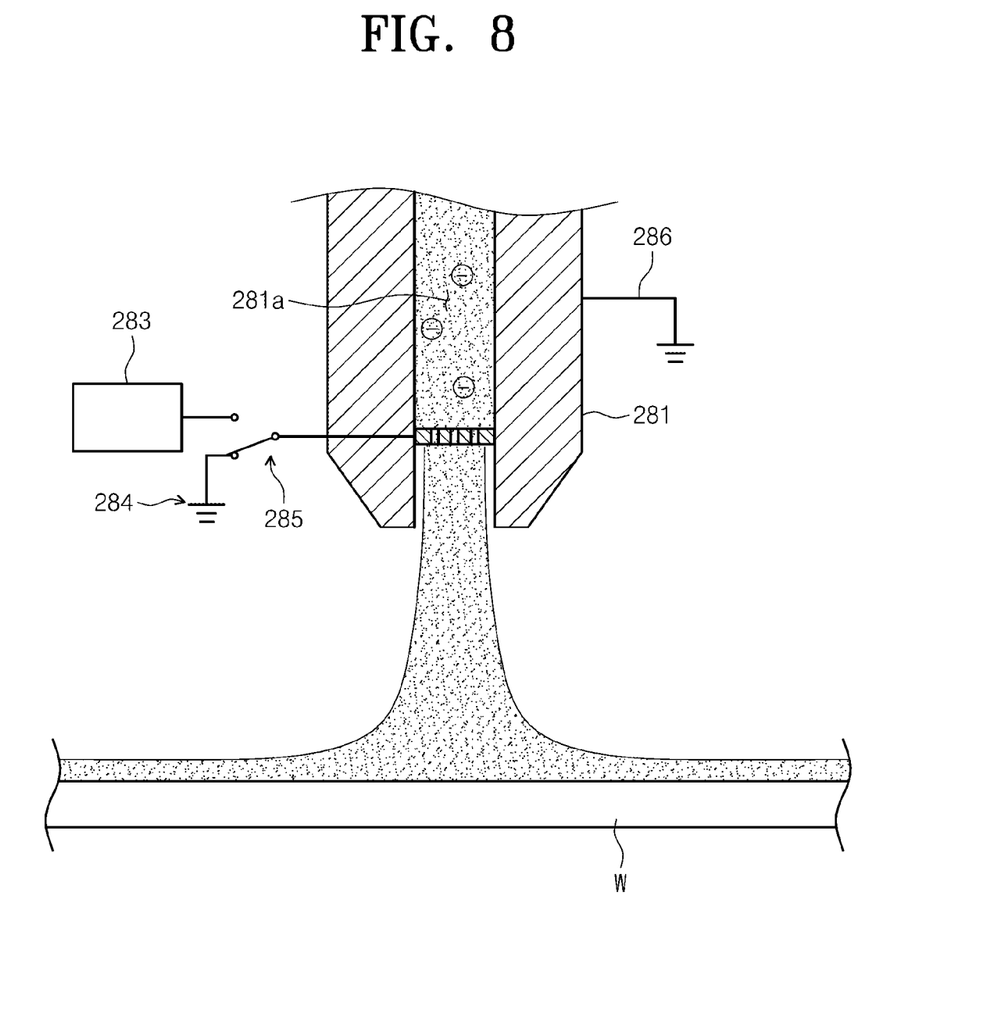
FIG. 8 shows a state in which an electrode 282 is connected to a ground line 284 such that chemical is supplied according to one embodiment.

Reference back to FIG. 5 and FIG. 6 is made. Further, reference to FIG. 8 is made. When the electrode 282 is connected to the ground line 284, the electrode 282 is able to discharge charges contained in the chemical to the ground. In other words, the chemical may be made electrically neutral. The electrical properties such as potential of the ultra-high purity chemical supplied from the above-described chemical supply apparatus 100 may be easily controlled. As a result, in a case where the treated wafer is electrically neutral, the ESD (Electro Static Discharge) phenomenon that occurs when the wafer and the chemical come into contact with each other may be suppressed.

Figure 9:
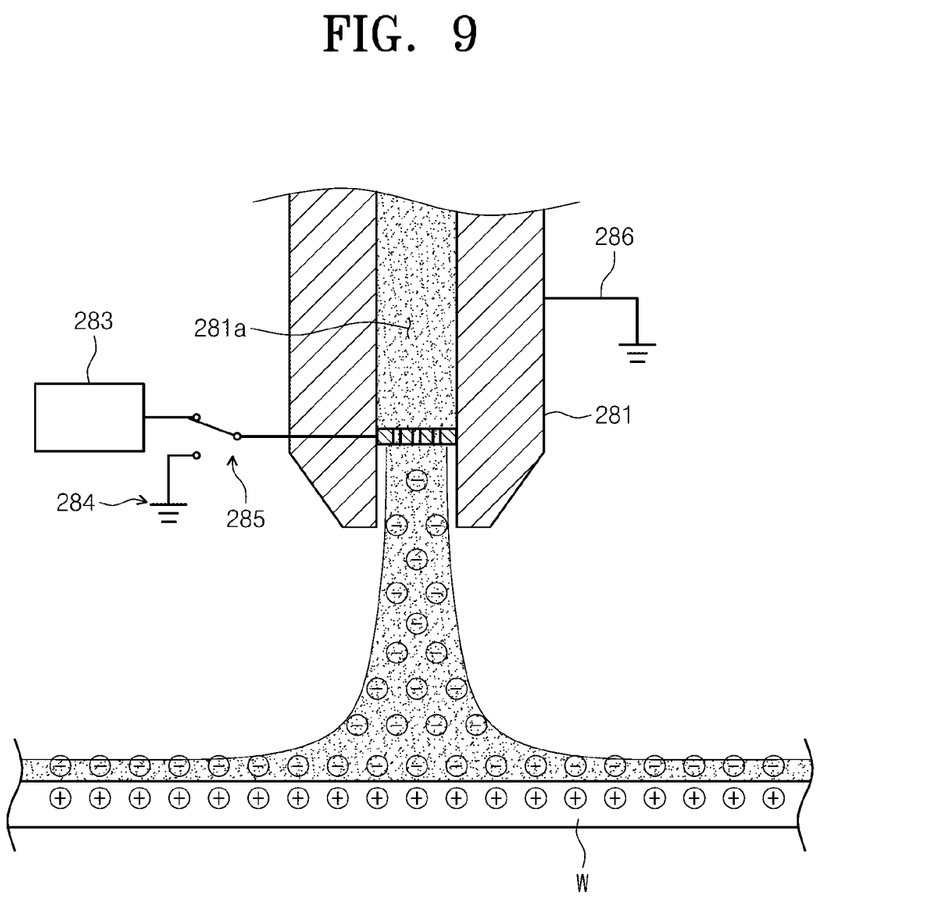
FIG. 9 shows a state in which the electrode 282 is connected to a power supply 283 such that chemical is supplied in accordance with an embodiment.

Referring to FIG. 5, FIG. 6, and FIG. 9, when the electrode 282 is connected to the power supply 283, the electrode 282 may make the chemical have electrical polarity. For example, when the electrode 282 is charged to a negative electrode, the supplied chemical may have a negative charge. Thus, when the wafer W is charged with a positive charge, the effect of trapping and removing the particles of the chemical onto the substrate charged with the positive charge and thus the effect of making the substrate electrically neutral may be obtained, thereby to prevent the ESD (Electro Static Discharge) phenomenon that occurs when the wafer and the chemical contact each other.

That is, the nozzle unit 28 may control the potential of the high-purity chemical, thereby to prevent the ESD (Electro Static Discharge) phenomenon that occurs when the wafer and the chemical contact each other.

In one example, an example in which the IPA is the chemical has been described. However, the chemical may not be limited particularly as long as the chemical is capable be purified and the potential thereof is able to be controlled.

In one example, an example has been described in which the electrode is included in the evaporation unit. However, a tip sonicator may be used in place of the electrode.

In one example, an embodiment in which the heater is included in the evaporation unit has been described. However, the evaporation unit may use a freeze-drying method rather than using high temperature and high pressure.

In one example, an embodiment has been described in which the heater is received in the evaporation unit. However, the heater may be disposed outside the evaporation unit.

In an embodiment of the inventive concept, the substrate may be efficiently treated.

In an embodiment of the inventive concept, the particles mixed with the chemical, preferably, the cations, the anions, the metal particles, and the nonpolar particles may be effectively removed.

In an embodiment of the inventive concept, the potential of the supplied chemical may be adjusted, and the potential of the highly purified chemical may be adjusted, thereby to prevent the ESD (Electro Static Discharge) phenomenon that occurs when the substrate and the chemical come into contact with each other.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A chemical supply apparatus comprising:
    an evaporation unit disposed downstream of a chemical supply source to vaporize supplied chemical thereto;
    a filter unit disposed downstream of the evaporation unit, wherein the filter unit filters impurities in the vaporized chemical while the vaporized chemical passes through the filter unit;
    a liquefaction unit disposed downstream of the filter unit to liquefy the vaporized chemical;
    a chemical storage tank disposed downstream of the liquefaction unit to store the liquefied chemical therein; and
    an electrode disposed at least in the evaporation unit,
    wherein the electrode electrically reacts with the chemical or particles in the chemical to change electrical properties of the chemical or the particles.

2. The chemical supply apparatus of claim 1, wherein the electrical reaction between the electrode and the chemical or the particles includes a reduction reaction of the particles.

3. The chemical supply apparatus of claim 1, wherein the electrical reaction between the electrode and the chemical or the particles includes polarization of the particles.

4. The chemical supply apparatus of claim 3, wherein the particles include nonpolar particles.

5. The chemical supply apparatus of claim 1, wherein the electrode is further disposed in the filter unit.

6. The chemical supply apparatus of claim 1, wherein the electrode is further disposed in the liquefaction unit.

7. The chemical supply apparatus of claim 1, wherein the electrode is further disposed at a front end of the filter unit.

8. The chemical supply apparatus of claim 1, wherein the evaporation unit includes a first evaporation unit and a second evaporation unit, wherein each of the first evaporation unit and the second evaporation unit includes the electrode.

9. The chemical supply apparatus of claim 1, wherein the particles include metal particles.

10. A nozzle unit comprising:
    a body having a supply channel defined therein through which chemical is supplied; and
    an electrode received in the supply channel,
    wherein the electrode is connected to a ground line or a power supply,
    wherein the electrode is embodied as a disk extending in a perpendicular manner to a length direction of the supply channel and holes or slits are formed in the disk and in a flow path direction to allow the chemical to pass therethrough.

11. The nozzle unit of claim 10, wherein the nozzle unit further comprises a controller,
    wherein the controller is configured to enable or disable connection between the electrode and the ground line and connection between the electrode and the power supply.

12. The nozzle unit of claim 10, wherein the power supply applies a negative voltage to the electrode.

13. A substrate treating apparatus comprising:
    an evaporation unit disposed downstream of a chemical supply source to vaporize supplied chemical thereto;
    a filter unit disposed downstream of the evaporation unit, wherein the filter unit filters impurities in the vaporized chemical while the vaporized chemical passes through the filter unit;
    a liquefaction unit disposed downstream of the filter unit to liquefy the vaporized chemical;
    a chemical storage tank disposed downstream of the liquefaction unit to store the liquefied chemical therein;
    an electrode disposed at least in the evaporation unit, wherein the electrode electrically reacts with the chemical or particles in the chemical to change electrical properties of the chemical or the particles;
    a container having a treating space defined therein;
    a support unit disposed in the treating space to support a substrate thereon; and
    a nozzle unit disposed downstream of the liquefaction unit and in fluid communication with the liquefaction unit, wherein the nozzle unit supplies the chemical onto the substrate supported on the support unit,
    wherein the nozzle unit includes:
        a body having a supply channel defined therein through which the chemical is supplied; and
        an other electrode received in the supply channel,
        wherein the other electrode of the nozzle unit is connected to a ground line or a power supply.

14. The substrate treating apparatus of claim 13, wherein the nozzle unit further comprises a controller,
    wherein the controller is configured to enable or disable connection between the other electrode and the ground line and connection between the electrode and the power supply.

15. The substrate treating apparatus of claim 13, wherein the power supply applies a negative voltage to the other electrode.

* * * * *